United States Patent
Conley, Jr. et al.

(10) Patent No.: US 7,462,499 B2
(45) Date of Patent: Dec. 9, 2008

(54) CARBON NANOTUBE WITH ZNO ASPERITIES

(75) Inventors: John F. Conley, Jr., Camas, WA (US); Yoshi Ono, Camas, WA (US); Lisa H. Stecker, Vancouver, WA (US); Sheng Teng Hsu, Camas, WA (US); Josh M. Green, Portland, OR (US); Lifeng Dong, Portland, OR (US); Jun Jiao, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 381 days.

(21) Appl. No.: 11/262,439

(22) Filed: Oct. 28, 2005

(65) Prior Publication Data

US 2007/0099441 A1    May 3, 2007

(51) Int. Cl.
    *H01L 21/00*    (2006.01)
(52) U.S. Cl. .................................. 438/20; 977/754
(58) Field of Classification Search ............. 438/20; 977/754
    See application file for complete search history.

(56) References Cited

U.S. PATENT DOCUMENTS

2006/0225162 A1* 10/2006 Yi ............................. 977/754
2007/0202673 A1*  8/2007 Kim et al. ................... 438/580
2007/0224104 A1*  9/2007 Kim ......................... 423/445 B

OTHER PUBLICATIONS

S.H. Ho, D. Banerjee, andn Z.F. Ren, "Field emission of zinc oxide nanowires grown on carbon cloth," Appl. Phys. Lett. 85(8), 1407 (2004).

D.Banerjee, S.H. Jo, and Z.F. Ren, "Enhanced field emission of ZnO nanowires," Adv. Mat. 16, 2028, (2004).

M. Sveningsson, R.E. Morjan, O.A. Nerushev, E.B. Campbell, D. Malsch, and J.A. Schaefer, "Highly efficient electron field emmission from decorated multiwalled carbon nanotube films," Appl. Phys. Lett. 85(19), 4487 (2004).

W.B. Choi, et al., "Fully sealed, high brightness carbon-nanotube field emission display," Appl. Phys. Lett. 75(20), 3129 (1999). Samsung group.

L. Dong, J. Jiao, C. Pan, D.W. Tuggle, "*Effects of catalysts on the internal structures of carbon nanotubes and corresponding electron field-emission properties*," Appl. Phys. A 78, 9 (2004).

* cited by examiner

*Primary Examiner*—Bradley W. Baumeister
*Assistant Examiner*—Matthew L Reames
(74) *Attorney, Agent, or Firm*—Law Office of Gerald Meliszewski; Gerald Maliszewski

(57) ABSTRACT

A ZnO asperity-covered carbon nanotube (CNT) device has been provided, along with a corresponding fabrication method. The method comprises: forming a substrate; growing CNTs from the substrate; conformally coating the CNTs with ZnO; annealing the ZnO-coated CNTs; and, forming ZnO asperities on the surface of the CNTs in response to the annealing. In one aspect, the ZnO asperities have a density in the range of about 100 to 1000 ZnO asperities per CNT. The density is dependent upon the deposited ZnO film thickness and annealing parameters. The CNTs are conformally coating with ZnO using a sputtering, chemical vapor deposition (CVD), spin-on, or atomic layer deposition (ALD). For example, an ALD process can be to deposit a layer of ZnO over the CNTs having a thickness in the range of 1.2 to 200 nanometers (nm).

15 Claims, 5 Drawing Sheets

Fig. 3A
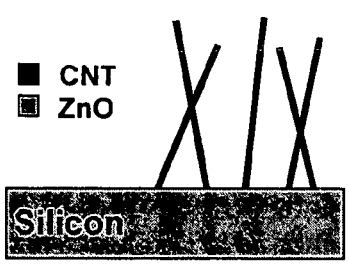
As deposited
Fig. 3B
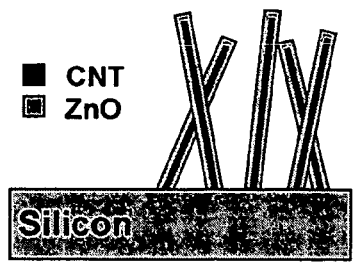
Post ALD coating
Fig. 3C
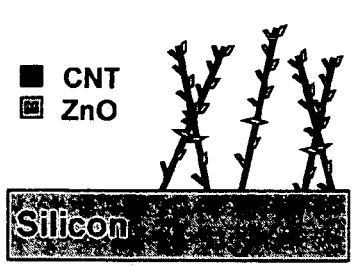
Post anneal
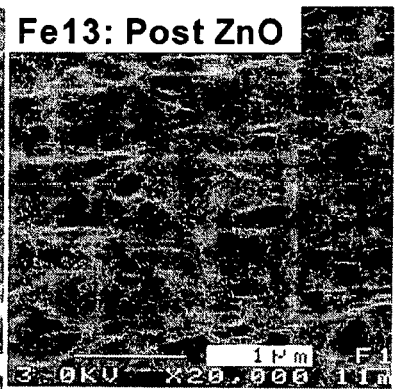
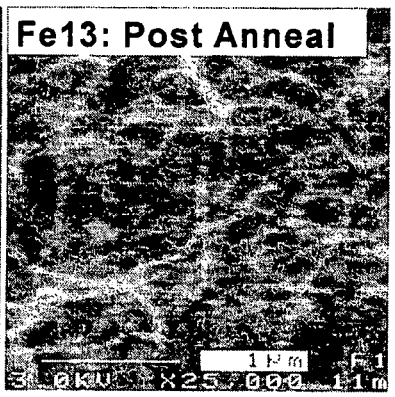
Fig. 4A
Fig. 4B
Fig. 4C

CARBON NANOTUBE WITH ZNO ASPERITIES

BACKGROUND OF THE INVENTION

1. Field of the Invention

This invention generally relates to integrated circuit and display fabrication and, more particularly, to a carbon nanotube field emission device, with ZnO asperities formed on the nanotubes.

2. Description of the Related Art

Due to their high conductivity and extreme tip sharpness, carbon nanotubes (CNTs) are known to be effective field emitters. The electrical properties CNTs promote high current densities, and the shape of the tube encourages a concentration of electric field lines, enabling the emission of electrons at low fields. The enhancement factor of a field emitter, or how much more easily than a planar surface it emits charge, is based on the geometry of the tip.

Methods for improving the field emission properties of nanotubes have tended to focus on the growth methods, to improve nanotube morphology, or isolation of single walled tubes. Among these are Dong et al. who tested various growth catalysts and Sveningsson et al., who achieved enhanced emission from thorn-like growths at the tips of long CNTs using Fe catalyzed decomposition of acetylene at 700° C.

The field enhancement factor, $\gamma$, is a measure of how easily a structure can emit electrons. As described by Dong et al., it as the ratio of the local field at the tip, to the applied field, and for a given material work function is related to the geometrical shape of the tip. It is defined as $F=gV/d$, where F is the local field on the tip of the tube, d is the distance between the two electrodes, and V is the applied voltage.

Recently, Bannerjee et al. and Jo et al. have described a technique to improve the field emission properties of ZnO nanowires. ZnO nanowires have also been identified as excellent field emitters, though not as good as CNTs. Their method involves growing ZnO nanowires on a carbon cloth. ZnO nanowires are grown via a vapor solid transport method that involves carbothermal reduction of ZnO by graphite powder at 1100° C. The carbon cloth consists of ~10 μm diameter carbon fibers. They conclude that the improvement of the ZnO field enhancement factor is due substantially to the unique high aspect ratio substrate, i.e. the ZnO enhancement factor is amplified by the high intrinsic high field enhancement factor of the underlying carbon fibers.

Nanotubes have found application in field emission flat panel displays, in which nanotube emitters are used to stimulate individual pixels. Other potential applications include field emission-based electronic, photonic, and sensing devices, cold cathode lighting sources, electron microscope sources. Any improvement of the enhancement factor of nanotubes would lead to an increase in the operating efficiency of these applications, and may open up new applications.

SUMMARY OF THE INVENTION

The present invention provides a post-growth method of improving field enhancement factor of CNTs that involves the atomic layer deposition (ALD) coating of CNTs with a thin film of ZnO, and subsequent annealing. In this method, ZnO beads or nanostructures, referred to herein as asperities, are formed on the surface of carbon nanotubes (diameter ~10 nm) or nanofibers (diameter ~10 μm). The ZnO nanostructures are formed via ALD coating and subsequent annealing, rather than vapor solid transport.

Accordingly, a method is provided for fabricating a nanotube with ZnO asperities. The method comprises: forming a substrate; growing carbon nanotubes (CNTs), with a surface, from the substrate; conformally coating the CNTs with ZnO; annealing the ZnO-coated CNTs; and, forming ZnO asperities on the surface of the CNTs in response to the annealing. In one aspect, the ZnO asperities have a density in the range of about 100 to 1000 ZnO asperities per CNT. The density is dependent upon the deposited ZnO film thickness and annealing parameters.

The CNTs are conformally coating with ZnO using sputtering, chemical vapor deposition (CVD), spin-on, or an atomic layer deposition (ALD). For example, an ALD process can be used to deposit a layer of ZnO over the CNTs, having a thickness in the range of 1.2 to 200 nanometers (nm).

The substrate can be a material such as Si, sapphire, SiC, quartz, glass, or plastic. The CNTs that are grown may be either single or multi-walled. The CNTs may have a diameter in the range of about 1 nm to 100 nm, a minimum length in the range of about 20 to 100 nm, and a maximum length of about 100 micrometers.

Additional details of the above-described method and a CNT field emission (FE) device with ZnO asperities are provided below.

BRIEF DESCRIPTION OF THE DRAWINGS

FIGS. 3A through 3C illustrate steps in the fabrication of a CNT FE device with ZnO asperities.

FIGS. 4A through 4C are scanning electron microscope (SEM) images, corresponding respectively to FIGS. 3A-3C.

DETAILED DESCRIPTION

Figure 1:
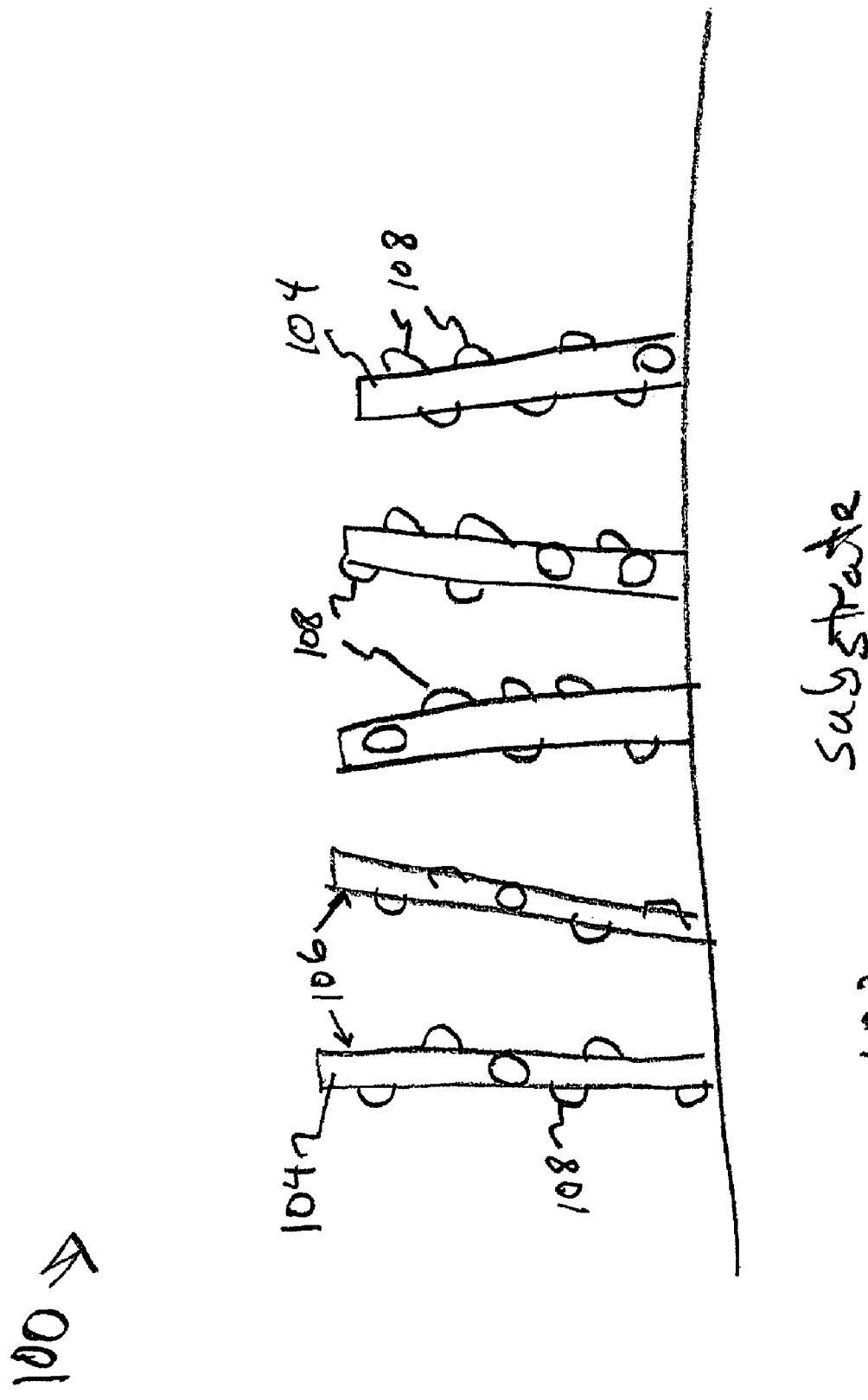
FIG. 1 is a partial cross-sectional view of a carbon (C) nanotube field emission (FE) device with ZnO asperities.

FIG. 1 is a partial cross-sectional view of a carbon (C) nanotube field emission (FE) device with ZnO asperities. The device 100 comprises a substrate 102. For example, the substrate 102 may be a material such as sapphire, SiC, quartz, glass, or plastic. While Si is probably the preferred substrate material, the device is not limited to any particular material. Carbon nanotubes (CNTs) 104, with a surface 106, overlie the substrate 102. In one aspect, the CNTs are grown from the substrate 102. For example, using a chemical vapor deposition (CVD) process. However, CNTs can also be grown using arc discharge or laser ablation methods. In other aspects the CNTs may be harvested, i.e., from soot, and dispensed on the substrate 102 in the form of a solution or powder. ZnO asperities 108 are shown on the outside surface 106 of the CNTs 104. An asperity is understood to be roughness on the outside surface of the CNTs resulting from the agglomeration of the ZnO into nanoparticles on the surface of the CNTs. In one aspect not shown, an insulating film is formed overlying the CNTs 104.

In another aspect, each ZnO asperity 108 includes ZnO nanoparticles. Typically, a ZnO asperity 108 includes a plurality of nanoparticles or grains. For example, the ZnO may be in a Wurtzite structure. The CNTs 104 may be single-walled (SW), multi-walled (MW), or a combination or single and multi-walled CNTs. As is understood in the art, a MW CNT would typically include several concentric cylinders of carbon tubes. The fabrication of SW or MW CNTs is dependent upon fabrication conditions.

Figure 2:
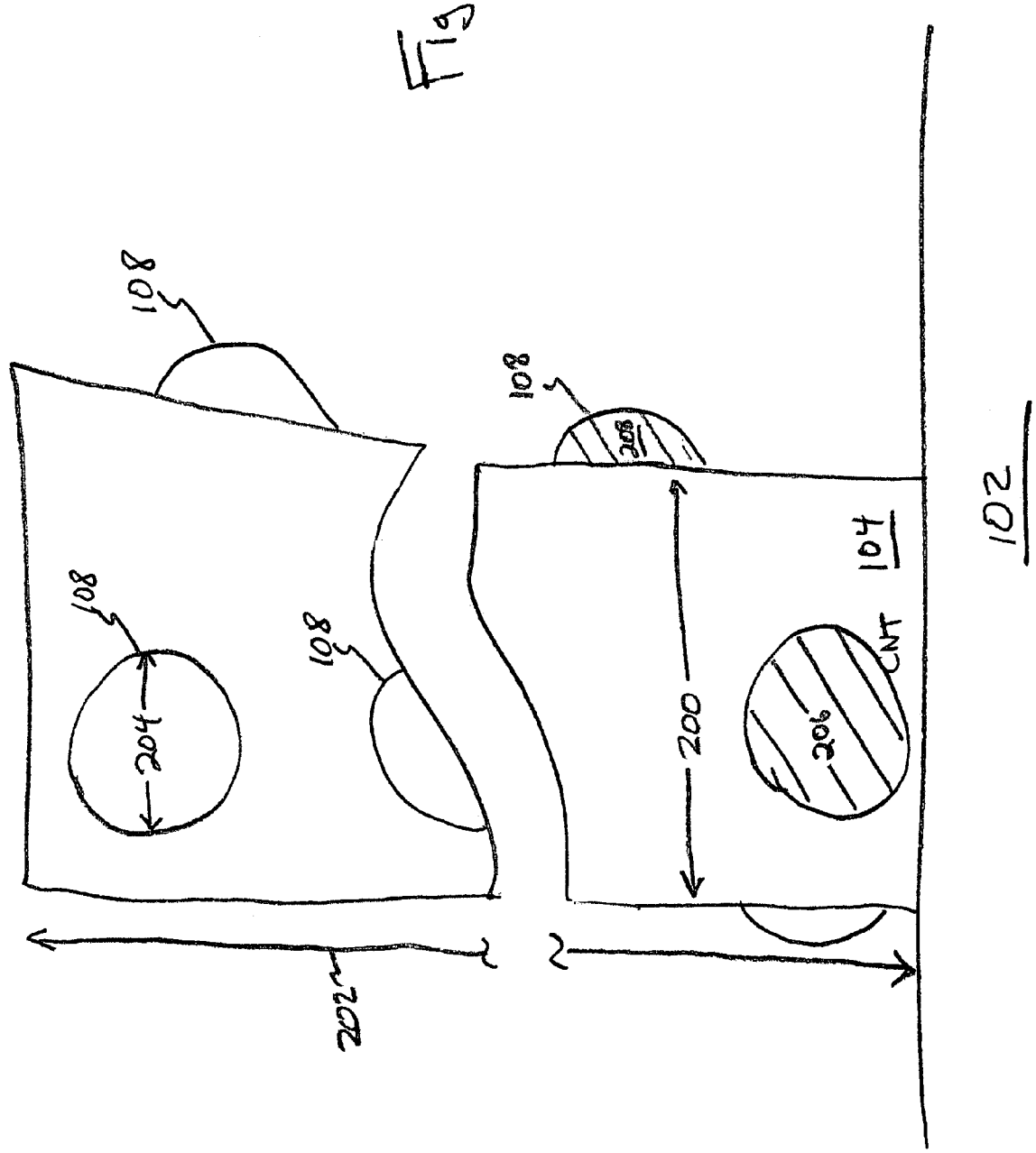
FIG. 2 is a partial cross-sectional view showing a CNT from FIG. 1 in greater detail.

FIG. 2 is a partial cross-sectional view showing a CNT from FIG. 1 in greater detail. Each CNT 104 has a typical diameter 200 in the range of about 1 nm to 100 nm. However, other diameters 200 are also possible. Each CNT 104 has a minimum length 202 in the range of about 20 to 100 nm and a maximum length 202 of about 100 micrometers. Again, other lengths are possible. In one aspect, the average length 202 is about 25 micrometers.

In one particular aspect, the CNTs 104 have a diameter 200 of about 60 nm. Then, the ZnO asperities 108 are formed about one every 20 nm, along the length 202 of a CNT. Continuing with the example, each ZnO asperity 108 has a surface area 206 of about 3600 square-nanometers and a volume 208 of about 33,000 cubic nanometers.

In another aspect, it can be said that the ZnO asperities 108 have a density in the range of about 100 to 1000 ZnO asperities per CNT. In a different aspect, the ZnO asperities 108 have a diameter 204 about equal to the CNT diameter 200.

Functional Description

FIGS. 3A through 3C illustrate steps in the fabrication of a CNT FE device with ZnO asperities.

FIGS. 4A through 4C are scanning electron microscope (SEM) images, corresponding respectively to FIGS. 3A-3C. To illustrate the invention, CNTs were grown on Si substrates at 700° C. using Fe to catalyze the decomposition of acetylene ($C_2H_2$). Other methods of growing CNTs may also be used, see FIG. 3A. The nanotubes were subsequently coated with approximately 9.5 nm of ZnO via atomic layer deposition, see FIG. 3B. The ALD process results in a highly conformal ZnO film coated on the nanotubes as shown in SEM image, see FIG. 4B. Alternative deposition techniques may also work, but conformal deposition is known to yield effective results.

The ALD ZnO-coated CNTs were then exposed to a 60 second, 900° C. anneal in $N_2$. The anneal results in the apparent agglomeration of the ZnO into nanoparticles on the surface of the CNT, as shown below in FIGS. 3C and 4C. The CNTs now appear to have a "pearl necklace" type structure.

Figure 5:
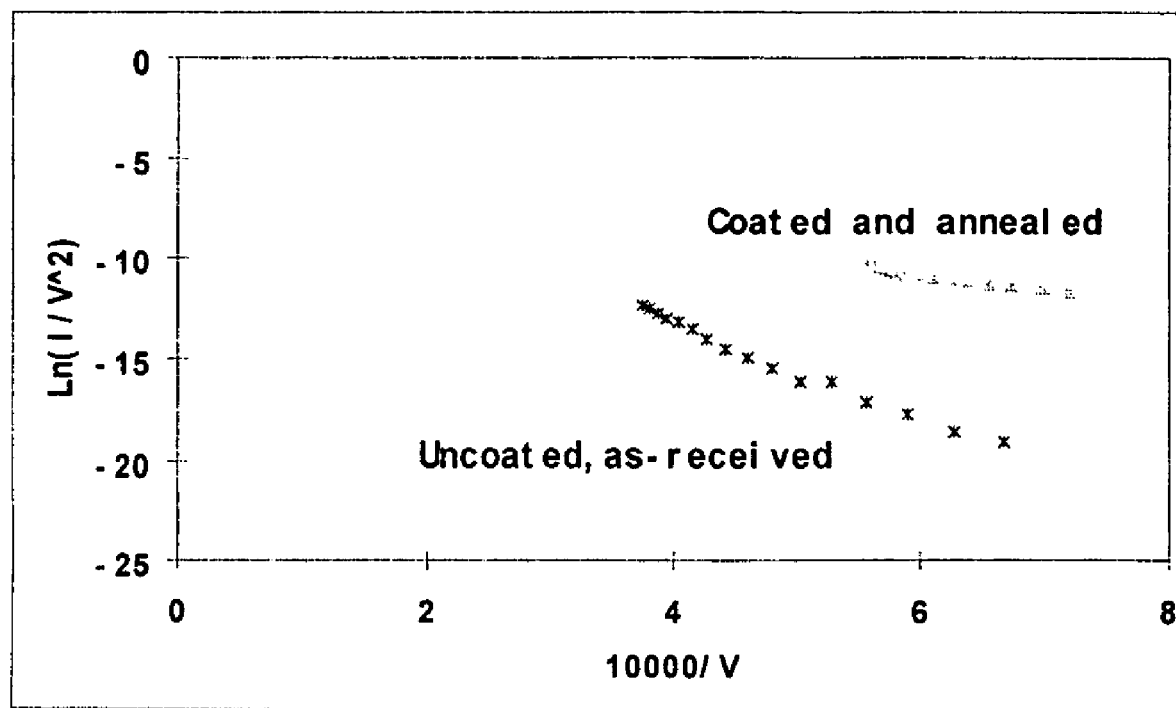
FIG. 5 is Fowler-Nodheim plot depicting the field enhancement factor.

FIG. 5 is Fowler-Nodheim plot depicting the field enhancement factor. The average field emission characteristics of the nanotubes as-received (corresponding to FIGS. 3A and 4A), and after-deposition and annealing (corresponding to FIGS. 3C and 4C) are summarized in the Fowler-Nodheim plot and tabulated in the table below. The enhancement factor of the nanotubes prior to coating was about 800. The enhancement factor of the nanotubes after ZnO coating and annealing was about 1920, demonstrating an improvement in field enhancement factor of over a factor of two. The CNT work function is assumed to be about 5 eV.

TABLE 1

| CNT Sample | Enhancement Factor | Turn-On/Threshold Fields |
|---|---|---|
| As deposited | 800 | 4.9/6.0 V/um |
| Post ~9.5 nm ZnO and subsequent 900° C. anneal | 1920 | 3.75/5.0 V/um |

In order to enhance the field emitting properties of CNTs, the minimum amount of ALD ZnO required, is believed to be at least two monolayers, or more than 1.5 nm. The thickness can be as high as half the average distance between CNTs. Realistically, a thickness of less than 200 nm is believed to be ideal.

The anneal condition and ambient can be any set of conditions that induces the agglomeration of the ZnO to form asperities on the surface of the CNT. The anneal ambient may also effect the conductivity of the ZnO nanostructures, which may effect the final field emitting properties. For example, hydrogen ambients are known to improve ZnO conductivity.

The ALD ZnO agglomeration technique can also be applied to carbon nanofibers (carbon nanotubes having a diameter larger than about 10 micrometers), $IrO_2$ nanowires, and anything else used for its field emitting properties, to enhance their performance.

Figure 6:
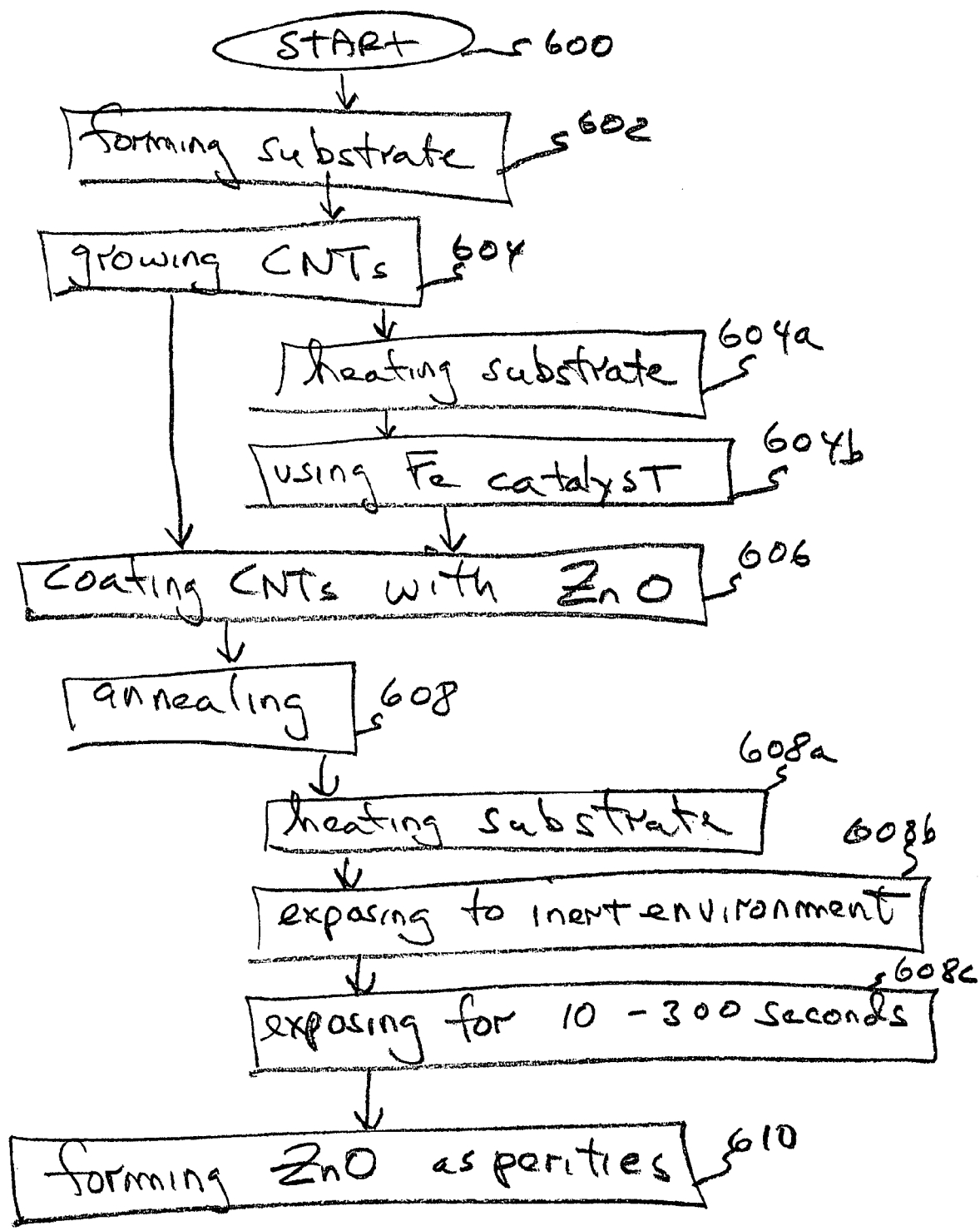
FIG. 6 is a flowchart illustrating a method for fabricating a nanotube with ZnO asperities.

FIG. 6 is a flowchart illustrating a method for fabricating a nanotube with ZnO asperities. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 600.

Step 602 forms a substrate. Preferably, the substrate is Si, however, materials such as sapphire, SiC, quartz, glass, plastic, and others would be known to one skilled in the art. In one aspect, Step 602 implants an n+ dopant in a Si substrate, forming an n+ layer of Si substrate. Step 604 grows carbon nanotubes (CNTs), with a surface, from the substrate. As mentioned above, Step 604 may use a CVD process, however, other methods are also known. In some aspects, the CNTs are formed using a pick-and-place or harvesting process. The CNTs may be either single or multi-walled CNTs. In another aspect, the CNTs have a minimum length in the range of about 20 to 100 nm and a maximum length of about 100 micrometers. Typically, the CNTs have a diameter in the range of about 1 nm to 100 nm.

Step 606 conformally coats the CNTs with ZnO. For example, conformally coating the CNTs with ZnO in Step 606 may include depositing ZnO using a sputtering, CVD, spin-on, or ALD process. In one aspect, Step 606 uses an ALD process to deposit a layer of ZnO over the CNTs having a thickness in the range of 1.2 to 200 nm.

Step 608 anneals the ZnO-coated CNTs. Step 610 forms ZnO asperities on the surface of the CNTs in response to the annealing. In one aspect, Step 610 forms a ZnO asperity density in the range of about 100 to 1000 ZnO asperities per CNT. Alternately considered, forming ZnO asperities on the surface of the CNTs in Step 610 includes agglomerating the ZnO into nanoparticles.

In one aspect, annealing the ZnO-coated CNTs in Step 608 includes substeps. Step 608*a* heats the substrate to a temperature in the range of about 400 to 950° C. Step 608*b* exposes the ZnO-coated CNTs to an inert gas environment, such as $N_2$, Ar, or He. Step 608*c* exposes the ZnO-coated CNTs for a duration in the range of about 10 to 300 seconds.

In another aspect, growing CNTs from the substrate in Step 604 includes substeps. Step 604*a* heats the substrate to a temperature of about 700° C. Step 604*b* uses Fe to catalyze the decomposition of acetylene ($C_2H_2$).

In one aspect, growing CNTs from the substrate in Step 604 includes growing CNTs having a diameter of about 60 nm, and Step 606 coats the CNTs with a ZnO layer of about 10 nm. Then, Step 610 forms one ZnO asperity about every 20 nm, along the length of a CNT. Continuing this example, each ZnO asperity has a surface area of about 3600 square-nanometers and a volume of about 33,000 cubic nanometers.

If Step 604 decreases the thickness of the deposited ZnO, then Step 610 forms ZnO asperities on the surface of the CNTs with a decreased distance between ZnO asperities, and a decreased ZnO asperity volume, in response to decreasing the ZnO thickness.

A field emission device made with ZnO asperity-covered CNTs has been provided, along with a corresponding fabrication process. A few examples of process details and dimensions have been given to illustrate the invention. However, the invention is not limited to just these examples. Besides field emission devices, the invention has use in nanotechnology, field emission based displays, cold cathode lighting sources, electron microscope sources, lightning arrestors, and x-ray sources. Other variations and embodiments of the invention would be suggested to one with skill in the art.

We claim:

1. A method for fabricating a nanotube with ZnO asperities, the method comprising:
    forming a substrate;
    growing carbon nanotubes (CNTs), with a surface, from the substrate;
    conformally coating the CNTs with ZnO;
    annealing the ZnO-coated CNTs; and,
    forming ZnO asperities on the surface of the CNTs in response to the annealing.

2. The method of claim 1 wherein forming ZnO asperities on the surface of the CNTs includes forming a ZnO asperity density in the range of about 100 to 1000 ZnO asperities per CNT.

3. The method of claim 1 wherein forming the substrate includes implanting an n+ dopant in a Si substrate, forming an n+ layer of Si substrate.

4. The method of claim 3 wherein conformally coating the CNTs with ZnO includes depositing ZnO using a deposition process selected from the group consisting of sputtering, chemical vapor deposition (CVD), spin-on, and atomic layer deposition (ALD).

5. The method of claim 1 wherein conformally coating the CNTs with ZnO includes using an ALD process to deposit a layer of ZnO over the CNTs having a thickness in the range of 1.2 to 200 nanometers (nm).

6. The method of claim 1 wherein annealing the ZnO-coated CNTs includes:
    heating the substrate to a temperature in the range of about 400 to 950° C.;
    exposing the ZnO-coated CNTs to an inert gas environment, selected from the group consisting of $N_2$, Ar, and He; and,
    exposing the ZnO-coated CNTs for a duration in the range of about 10 to 300 seconds.

7. The method of claim 1 wherein forming ZnO asperities on the surface of the CNTs includes agglomerating the ZnO into nanoparticles.

8. The method of claim 1 wherein forming the substrate includes forming a substrate from a material selected from the group consisting of Si, sapphire, SiC, quartz, glass, and plastic.

9. The method of claim 1 wherein growing CNTs from the substrate includes growing CNTs selected from the group consisting of single and multi-walled CNTs.

10. The method of claim 1 wherein growing CNTs includes growing CNTs having a diameter in the range of about 1 nm to 100 nm.

11. The method of claim 1 wherein growing CNTs from the substrate includes growing CNTs as follows:
    heating the substrate to a temperature of about 700° C.; and,
    using Fe to catalyze the decomposition of acetylene ($C_2H_2$).

12. The method of claim 1 wherein growing CNTs from the substrate includes growing CNTs having a minimum length in the range of about 20 to 100 nm and a maximum length of about 100 micrometers.

13. The method of claim 1 wherein growing CNTs from the substrate includes growing CNTs having a diameter of about 60 nm and having a length;
    wherein conformally coating the CNTs with ZnO includes coating the CNTs with a ZnO layer of about 10 nm; and,
    wherein forming ZnO asperities on the surface of the CNTs includes forming one ZnO asperity about every 20 nm, along the length of a CNT.

14. The method of claim 13 wherein forming ZnO asperities on the surface of the CNTs includes forming ZnO asperities, each having a surface area of about 3600 square-nanometers and a volume of about 33,000 cubic nanometers.

15. The method of claim 1 wherein conformally coating the CNTs with ZnO includes decreasing the thickness of the deposited ZnO; and,
    wherein forming ZnO asperities on the surface of the CNTs includes decreasing the distance between ZnO asperities, and decreasing the volume of each ZnO asperity, in response to decreasing the ZnO thickness.

* * * * *